United States Patent [19]

Robinson

[11] Patent Number: 5,428,566
[45] Date of Patent: Jun. 27, 1995

[54] NONVOLATILE MEMORY CARD WITH READY AND BUSY INDICATION AND PIN COUNT MINIMIZATION

[75] Inventor: Kurt B. Robinson, Newcastle, Calif.

[73] Assignee: Intel Corporation, Santa Clara, Calif.

[21] Appl. No.: 144,196

[22] Filed: Oct. 27, 1993

[51] Int. Cl.⁶ .................. G11C 5/06; G11C 16/06
[52] U.S. Cl. .................................... 365/65; 365/51; 365/52; 365/148; 365/182; 365/189.01; 365/226; 365/227; 365/900; 365/230.03
[58] Field of Search .............. 365/51, 52, 63, 174, 365/148, 182, 189.01, 226, 227, 229, 900, 230.03

[56] References Cited

U.S. PATENT DOCUMENTS

| | | | |
|---|---|---|---|
| 4,460,982 | 7/1984 | Gee et al. | 365/104 |
| 4,763,305 | 8/1988 | Kuo | 365/200 |
| 5,130,947 | 7/1992 | Reed | 365/227 |
| 5,185,869 | 2/1993 | Suzuki | 395/375 |
| 5,222,046 | 6/1993 | Kreifels et al. | 365/230.06 |
| 5,224,070 | 6/1993 | Fandrich et al. | 365/185 |
| 5,267,218 | 11/1993 | Elbert | 365/226 |
| 5,301,161 | 4/1994 | Landgraf et al. | 365/229 |
| 5,329,491 | 7/1994 | Brown et al. | 365/226 |

FOREIGN PATENT DOCUMENTS

0487328  5/1992  European Pat. Off. .............. 365/52

OTHER PUBLICATIONS

—Personal Computer Memory Card International Association PC Card Standard Release 2.0, pp. 1–1 through 4–34 (Sep. 1991).

*Primary Examiner*—Joseph A. Popek
*Assistant Examiner*—Andrew Q. Tran
*Attorney, Agent, or Firm*—Blakely, Sokoloff Taylor & Zafman

[57] ABSTRACT

A memory card includes a plurality of nonvolatile memories, each having a pad for applying a busy signal indicating that a respective memory is busy and a circuit for coupling the busy signal to the pad. The pad of each memory is coupled to a node external to the memories. A resistive circuit is used for coupling a first voltage to the node. When each of the memories does not output the busy signal at the pad, the node assumes a first voltage. When the pad of at least one of the memories outputs the busy signal, the node assumes a ground voltage. An output pin is used for supplying a card busy output signal when at least one of the memories is indicated busy and an input pin is coupled to the node for receiving the card busy output signal at the node. A pass logic is coupled to the input and output pins for passing the card busy output signal directly from the input pin to the output pin. Each of the memories also includes an input pad for receiving a global power down control signal and a register for receive a software power down control signal. A logic gate is used to allow either of the signals to pass.

18 Claims, 5 Drawing Sheets

NONVOLATILE MEMORY CARD WITH READY AND BUSY INDICATION AND PIN COUNT MINIMIZATION

FIELD OF THE INVENTION

The present invention pertains to the field of computer memories. More particularly, this invention relates to an electrically erasable and programmable floating gate nonvolatile memory card with ready and busy indication and pin count minimization such that circuitry of the card control logic of the memory card is simplified and the speed of the memory card is increased.

BACKGROUND OF THE INVENTION

Prior art personal computer systems typically employ removable data storage media. One common prior art removable storage medium is a floppy disk. A relatively new prior art storage medium is an integrated circuit-based memory card ("IC memory card").

Prior art flash erasable and electrically programmable read-only memory ("flash EPROM") is nonvolatile and reprogrammable, and this has permitted the flash EPROM technology to be used for removable data storage. One such prior art application is the flash EPROM memory card ("flash memory card"). The flash memory card typically includes a number of flash EPROMs. The flash memory card can be erased and programmed electrically.

Figure 1:
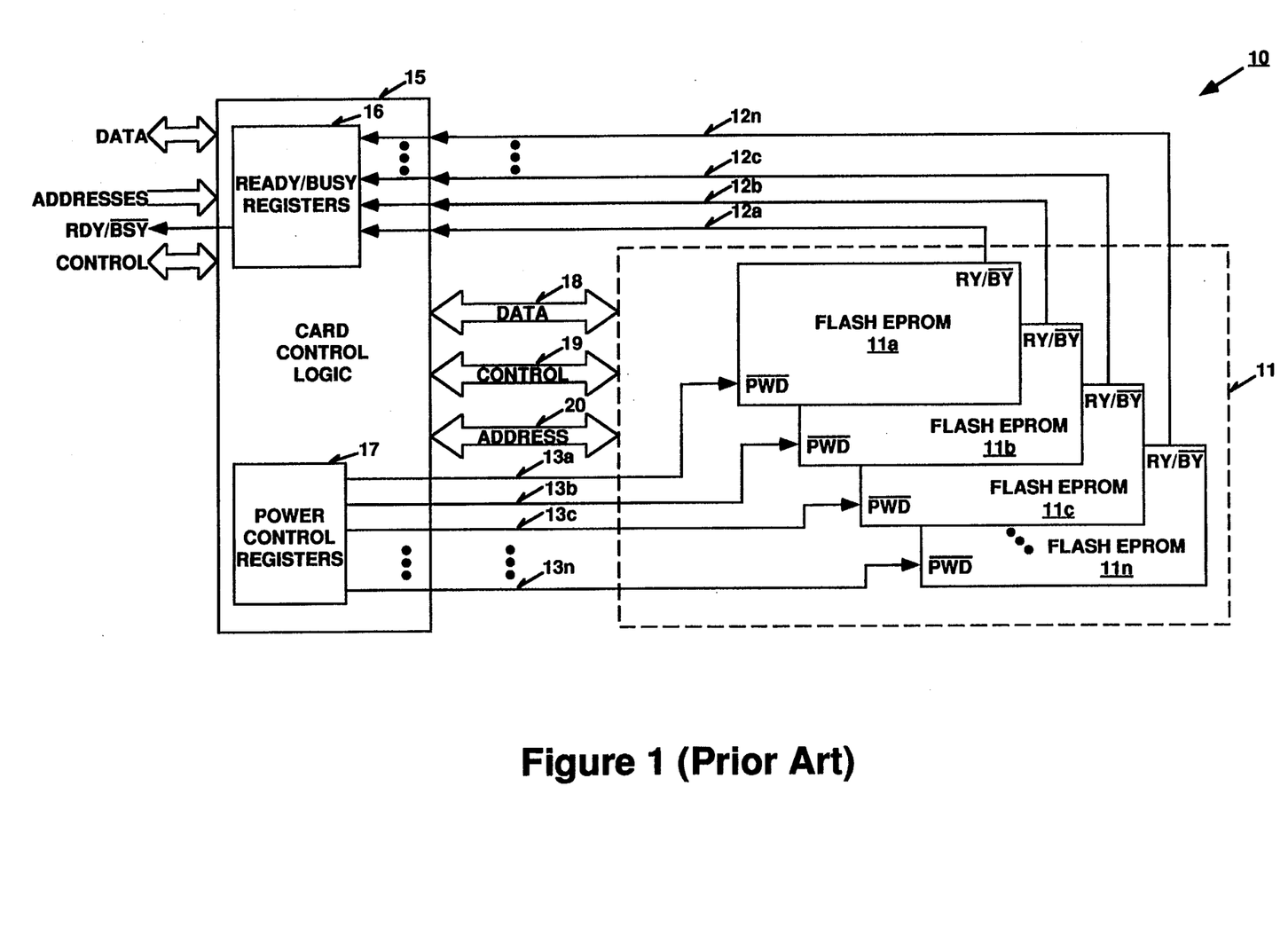
FIG. 1 is a block diagram of a prior art flash memory card that includes ready/busy registers in a card control logic of the card.

FIG. 1 illustrates a prior art flash memory card 10. As can be seen from FIG. 1, flash memory card 10 includes a memory array 11 and a card control logic 15. Memory array 11 includes a number of flash EPROMs 11a through 11n. Card control logic 15 interfaces memory array 11 with external host computer.

As can be seen from FIG. 1, each of flash EPROMs 11a-11n typically includes a ready/busy output pin RY/$\overline{BY}$. Ready/busy RY/$\overline{BY}$ is the ready/busy indicator of each of flash EPROMs 11a-11n. A logical high RY/$\overline{BY}$ output of a flash EPROM indicates a "ready" condition or mode for the flash EPROM (i.e., ready to accept an operation). A logical low RY/$\overline{BY}$ output indicates a "busy" condition or mode for the flash EPROM. Typically, a flash EPROM includes a control circuit that controls the memory operations of the flash EPROM. The "busy" condition or mode for the flash EPROM means that the control circuit of the flash EPORM is presently busy in performing the programming or erasure operation.

As also can be seen from FIG. 1, card control logic 15 includes ready/busy registers 16 and associated gating logic (not shown) for applying a card ready/busy output signal RDY/$\overline{BSY}$ to the external circuitry. The number of registers 16 corresponds to the member of flash EPROMs 11a-11n in memory array 11. Each of registers 16 receives a ready/busy RY/$\overline{BY}$ signal from the RY/$\overline{BY}$ output of the corresponding flash EPROM. A signal line (i.e., one of signal lines 12a through 12n)is connected between one of registers 16 and the RY/$\overline{BY}$ output pin of the respective flash EPROM for transferring the RY/$\overline{BY}$ signal to that register from the associated flash EPROM.

The provision of the ready/busy registers in the card control logic to store the ready/busy RY/$\overline{BY}$ signal from each of the flash EPROMs allows the card control logic to selectively mask out the ready/busy RY/$\overline{BY}$ signal from any one of the flash EPROMs inside the prior art flash memory card. As is known, the RY/$\overline{BY}$ signal of a flash EPROM is an active low signal when the control circuit of the flash EPROM is busy performing either a programming operation or an erasure operation. However, the time for the programming operation is typically much less than that for the erasure operation. Therefore, the busy indication of the RY/$\overline{BY}$ signal can be ignored (i.e., masked) when the respective flash EPROM is undergoing the programming operation. When the RY/$\overline{BY}$ signal of a particular flash EPROM is masked, then the ready/busy status of that particular flash EPROM will have no effect on the card ready/busy output RDY/$\overline{BSY}$ of the card control logic. The mask function is typically accomplished by the gating logic (not shown) associated with the ready/busy registers.

In addition, card control logic 15 of prior flash memory card 10 of FIG. 1 also includes power control registers 17, each storing the power control signal $\overline{PWD}$ for its respective one of flash EPROMs 11a-11n. A signal line (i.e., one of signal lines 13a-13n) is connected to one of power control registers 17 and its respective one of flash EPROMs 11a-11n for supplying the power control signal $\overline{PWD}$ to the respective flash EPROM.

One disadvantage of the prior flash memory card is that the flash memory card typically requires separate signal lines to transfer the individual ready/busy RY/$\overline{BY}$ signals to the ready/busy registers inside the card control logic. This typically causes the pin count of the card control logic to increase which typically occupies large die space of the card control logic. In addition, the card control logic needs to provide the ready/busy registers to latch the individual ready/busy signal from each of the flash EPROMs. This typically occupies relatively large die space of the card control logic and complicates the logic of the card control logic. Moreover, the software running in the card control logic is typically complicated. This is because during a normal memory operation, both (1) the attribute memory region of the flash memory card that contains the ready/busy registers and (2) the common memory region of the card that includes the flash EPROMs need to be accessed.

Furthermore, the prior art scheme of providing the individual power control signal $\overline{PWD}$ as shown in FIG. 1 also bears the disadvantage of excessive pin count for the card control logic and complex logic in the card control logic. As shown in FIG. 1, power control registers 17 includes a number of registers such that each of flash EPROMs 11a-11n receives an individual power control $\overline{PWD}$ signal.

SUMMARY AND OBJECTS OF THE INVENTION

One of the objects of the present invention is to reduce the pin count of a card control logic of a nonvolatile memory card.

Another object of the present invention is to simplify the circuitry of a card control logic of a nonvolatile memory card.

Another object of the present invention is to simplify the software running in the card control logic of the nonvolatile memory card.

Another object of the present invention is to provide a nonvolatile memory card with a simplified card control logic and reduced the number of pins of the card control logic.

A further object of the present invention is to provide a simplified card control logic of a nonvolatile memory card that allows fast access to the nonvolatile memories inside the card through the card control logic.

A still further object of the present invention is to reduce the number of pins of the card control logic of a nonvolatile memory card so as to allow the nonvolatile memory card to contain more nonvolatile memories.

A nonvolatile memory is described that includes a memory array. A control circuit is coupled to the memory array for controlling memory operations with respect to the memory array. An output pad is used for applying a signal to an external circuit indicating that the control circuit is busy with respect to one of the memory operations. A circuit is used for coupling the signal to the output pad by connecting the output pad to ground. The circuit includes an open drain transistor circuit coupled between the output pad and ground. The circuit includes an open drain transistor circuit coupled between the output pad and ground such that the output pad can be tied together with an output pad of another nonvolatile memory.

A memory card for use in a computer system is described that includes a plurality of nonvolatile memories. Each of the memories further comprises a pad for applying a busy signal indicating that one of the memories is busy with respect to a memory operation and a circuit for coupling the busy signal to the pad by coupling the output pad to ground. The circuit includes an open drain transistor circuit coupled between the output pad and ground. The pad of each of the memories is coupled to a node external to the memories. A resistive circuit is used for coupling a first voltage to the node. When each of the memories does not output the busy signal at the pad, the node assumes a voltage which is approximately equal to the first voltage. When the pad of at least one of the memories outputs the busy signal, the node assumes a ground voltage. A card control logic is coupled to the memories for interfacing the memories with an external circuit that further includes an output pin for supplying a card busy signal to the external circuit when at least one of the memories is indicated to be busy with respect to the memory operation and an input pin coupled to the node for receiving the card busy signal at the node. The input pin receives the card busy signal when the node assumes the ground voltage. A pass logic is coupled to the input and output pins for passing the signal directly from the input pin to the output pin such that the card control logic has minimized pin count.

The nonvolatile memory further includes an input pad for receiving a global power down control signal and a power down control register for receiving a software power down control signal. A logic gate is coupled to allow either of the signals to be applied to the control circuit such that the nonvolatile memory can be powered off by one of the global power down control signal and the software power down control signal. The card control logic has a single output pin that applies the global power down control signal to the input pad of each of the nonvolatile memories such that the card control logic has minimized pin count to enable high storage capacity.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 2:
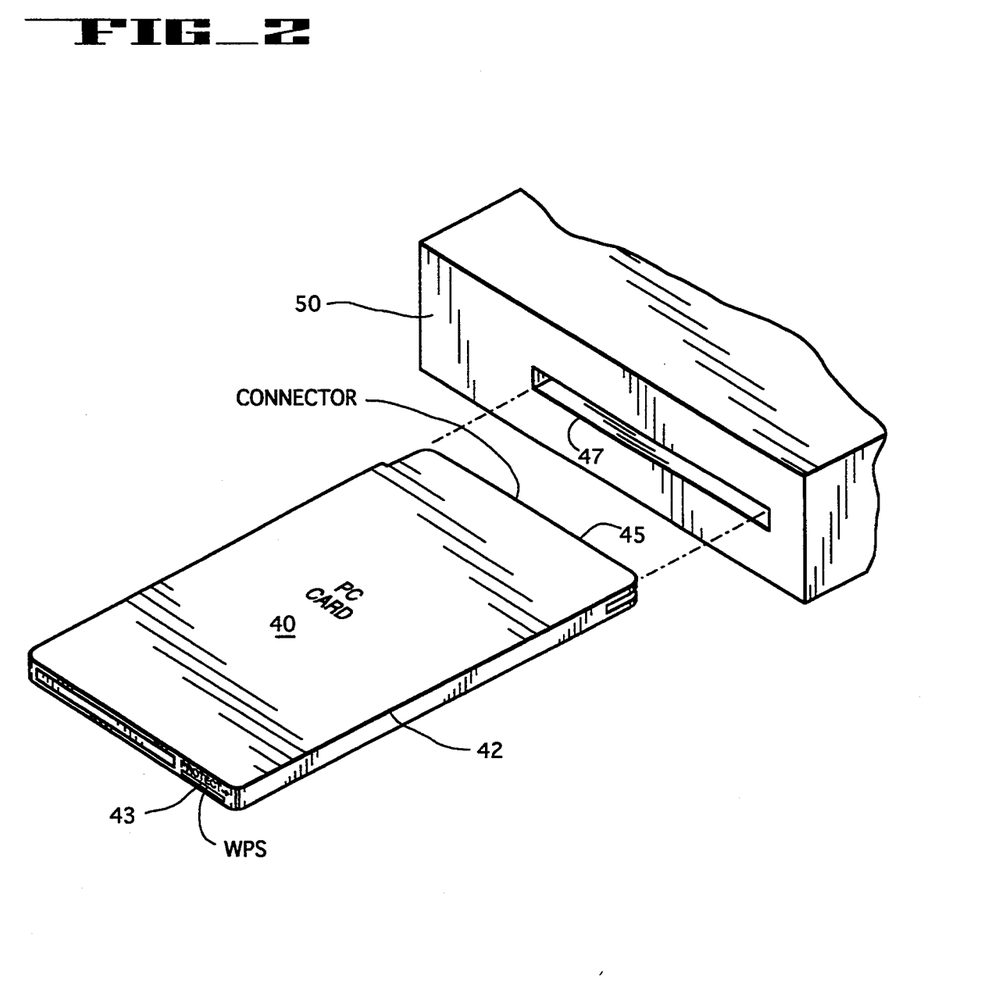
FIG. 2 is a perspective view of a flash memory card.

FIG. 2 is a perspective view of a flash memory card 40. Inside plastic case 42 of flash memory card 40 there are a plurality of flash EPROMs (not shown in FIG. 2) for storing data at addresses. Alternatively, plastic case 42 can be a metal case. Flash memory card 40 is inserted to a slot 47 of a personal computer 50 for a memory read or write operation.

Card 40 includes connector 45 located on one side of card 40 to connect card 40 to personal computer 50 when the connector 45 is inserted into slot 47. Card 40 also includes a write protection switch ("WPS") 43.

Computer 50 can be a portable computer, a laptop computer, a desk-top computer, a workstation, a minicomputer, a mainframe, or any other type of computer. Computer 50 includes a central processing unit, a memory, and other peripheral devices (all are not shown).

Figure 3:
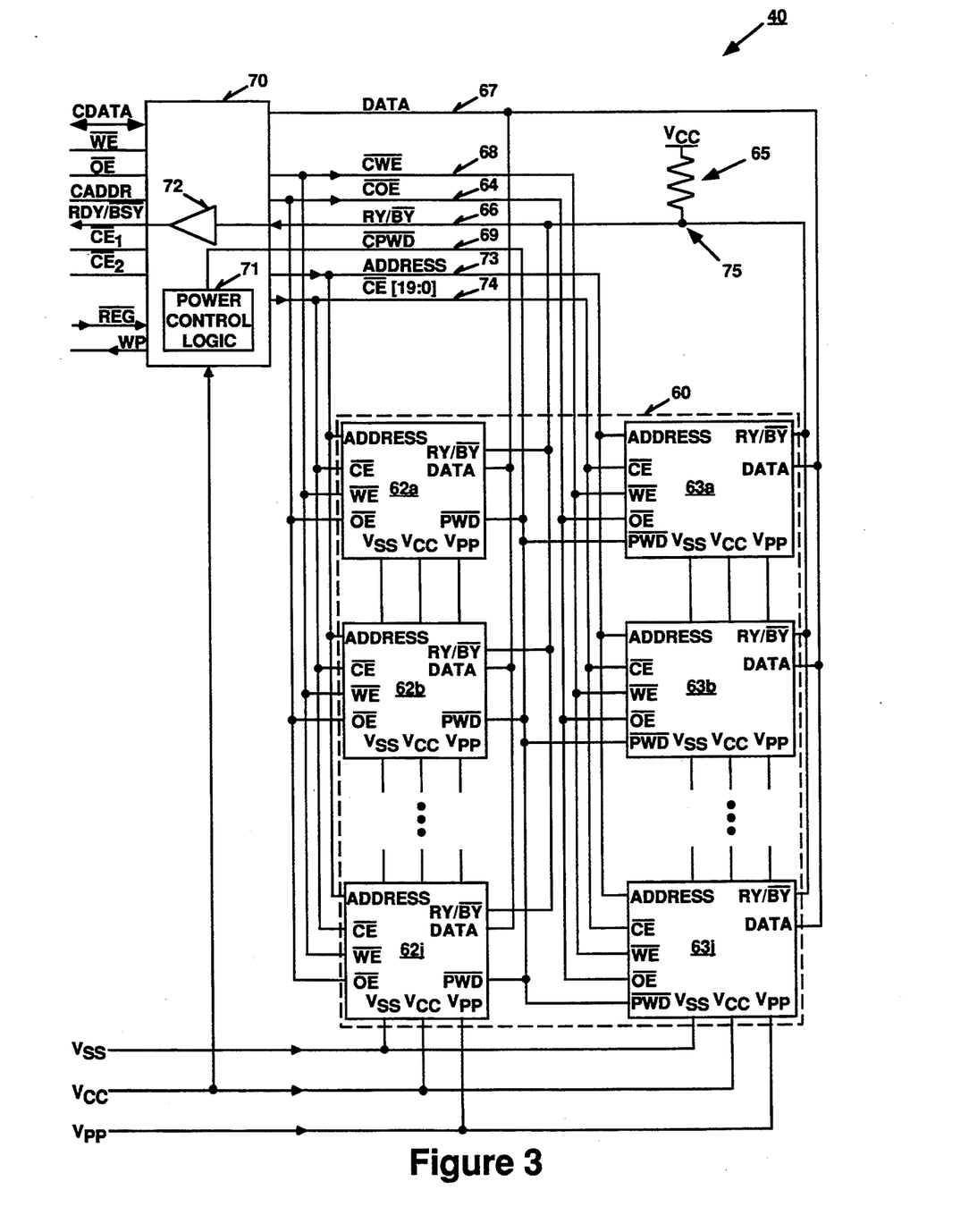
FIG. 3 shows block diagram of the flash memory card of FIG. 2, which includes a plurality of flash EPROMs and a card control logic with a minimized pin count and without ready/busy registers in the card control logic.

FIG. 3 is a block diagram of flash memory card 40 of FIG. 2. Flash memory card 40 includes a memory array 60 that includes a plurality of flash EPROMs 62a through 62j and 63a through 63j, each of which includes memory cells that store data at addresses. For one embodiment, memory array 60 includes twenty flash EPROMs.

As will be described below in more detail, flash memory card 40 supplies a card ready/busy output $RDY/\overline{BSY}$ signal to an external host computer without requiring ready/busy registers in the card control logic. Moreover, the input pin count of the card control logic is minimized. The ready/busy $RY/\overline{BY}$ output pin of each of flash EPROMs 62a-62j and 63a-63j is tied together to a power supply voltage via a resistor. An open drain transistor is used in each of flash EROMs 62a-62j and 63a-63j to connect between the ready/busy $RY/\overline{BY}$ output pin of each of flash EPROMs 62a-62j and 63a-63j and ground. In each of flash EPROMs 62a-62j and 63a-63j, a control register is used to cause the ready/busy $RY/\overline{BY}$ output pin to output a busy signal by connecting the $RY/\overline{BY}$ pin to ground via the open drain transistor. Each of flash EPROMs 62a-62j and 63a-63j can mask the ready/busy $RY/\overline{BY}$ signal by not writing to the control register the busy indication of the flash EPROM.

For other embodiments, memory array 60 may include more or fewer than twenty flash EPROMs. For example, memory array 60 may include two to eighteen flash EPROMs.

For one embodiment, flash memory card 40 can store 40 megabytes ("Mbytes") of data. For other embodiments, flash memory card 40 can store more than 40 Mbytes of data. For example, flash memory card 40 can store 64 Mbytes of data.

For one embodiment, each of flash EPROMs 62a–62j and 63a–63j can store sixteen Mbits (i.e., megabits) of data. For other embodiments, each of flash EPROMs 62a–62j and 63a–63j of memory array 60 stores more or fewer than sixteen Mbits of data.

Each of flash EPROMs 62a–62j and 63a–63j within memory array 60 includes address inputs ADDRESS and data pins DATA. Addresses are latched into each of flash EPROMs 62a–62j and 63a–63j via the respective address inputs. Data are latched through the data pins of each of flash EPROMs 63a–62j and 63a–63j.

Each of flash EPROMs 62a–62j and 63a–63j includes a write enable input pin $\overline{WE}$, an output enable input pin $\overline{OE}$, and a chip enable input pin $\overline{CE}$. The $\overline{WE}$, $\overline{OE}$, and $\overline{CE}$ inputs are each active low. Chip enable $\overline{CE}$ is the device select for each of flash EPROMs 62a–62j and 63a–63j and is used for device selection. Output enable $\overline{OE}$ is the output control for each of flash EPROMs 62a–62j and 63a–63j and is used to gate data from the data pins. A logic low $\overline{WE}$ input to a particular flash EPROM allows that flash EPROM to be written to if the $\overline{CE}$ input for that flash EPROM is logically low.

Each of flash EPROMs 62a–62j and 63a–63j also includes a program/erase power supply voltage input $V_{PP}$, a device power supply input $V_{CC}$, and a $V_{SS}$ input. For one embodiment, flash EPROMs 60 require $V_{PP}$ to be approximately 12.0 volts. $V_{SS}$ is ground.

In absence of a high (i.e., 12 volts) $V_{PP}$ voltage applied to a respective one of flash EPROMs 62a–62j and 63a–63j, the flash EPROM acts as a ready-only memory. When a 12 volt $V_{PP}$ voltage is applied to a respective one of flash EPROMs 62a–62j and 63a–63j, the contents of that flash EPROM can be erased by an erasure operation and the device may then be reprogrammed with new data via a programming operation. Each of flash EPROMs 62a–62j and 63a–63j includes a control circuit (shown in FIG. 5) that performs the erasure and programming operations. The control circuit will be described in more detail below, in conjunction with FIG. 5.

Referring again to FIG. 3, each of flash EPROMs 62a–62j and 63a–63j also includes a power down pin $\overline{PWD}$. Power down pin $\overline{PWD}$ for a flash EPROM is the power down mode control. When the power down $\overline{PWD}$ signal at one of flash EPROMs 62a–62j and 63a–63j is a logical low level, that flash EPROM enters the power down mode.

Each of flash EPROMs 62a–62j and 63a–63j also includes a ready/busy output pin RY/$\overline{BY}$. Ready/busy RY/$\overline{BY}$ is the ready/busy indicator of each of flash EPROMs 62a–62j and 63a–63j. A logically high RY/$\overline{BY}$ output of a flash EPROM indicates a "ready" condition or mode for the flash EPROM (i.e., ready to accept an operation). A logically low RY/$\overline{BY}$ output indicates a "busy" condition or mode for the flash EPROM (i.e., the control circuit is presently busy).

Figure 5:
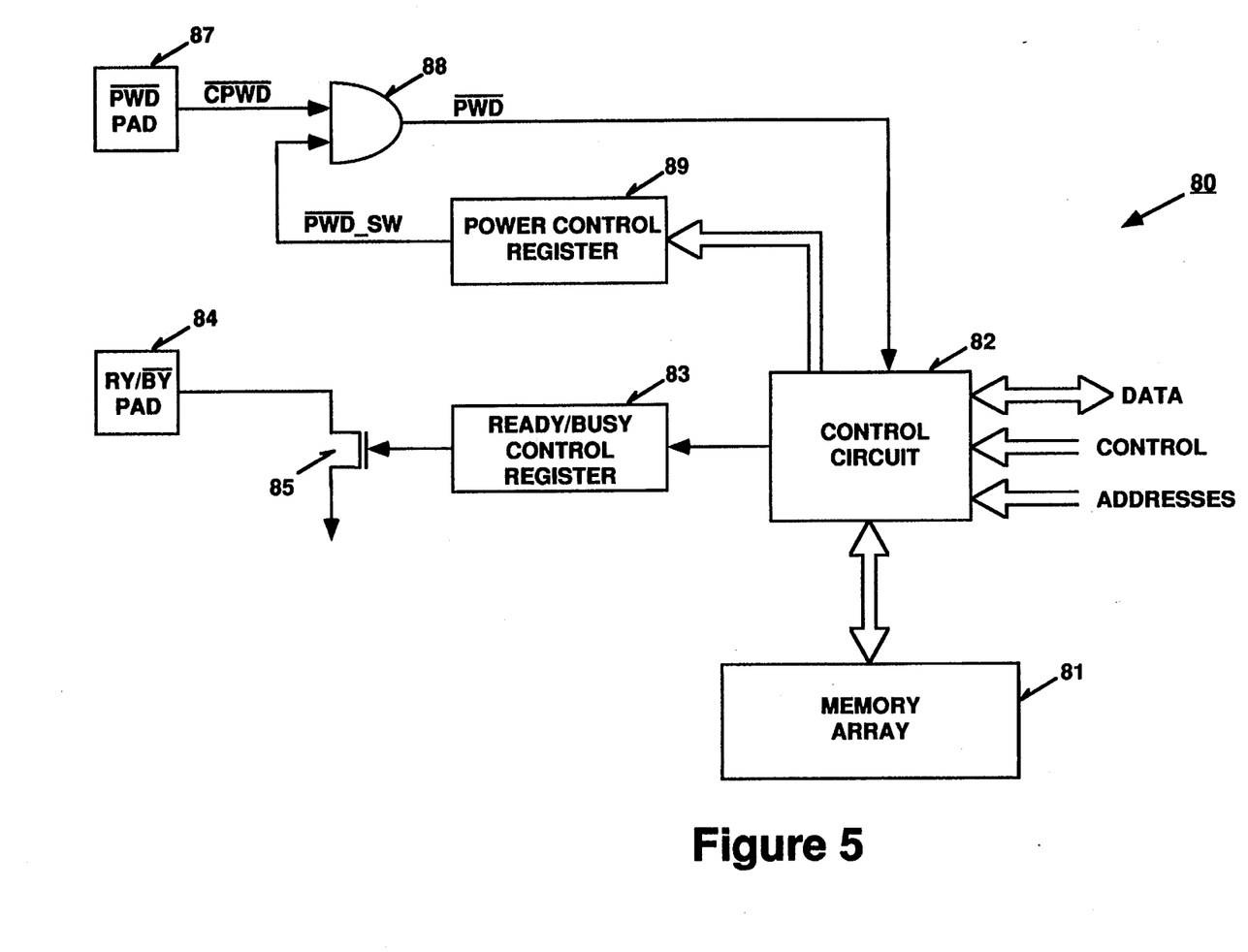
FIG. 5 is a circuit diagram of one of the flash EPROMs of FIGS. 3-4, including the circuit to generate and apply the individual ready/busy $RY/\overline{BY}$ signal and the circuit for generating the power down control signal $\overline{PWD}$.

Referring to FIG. 5, a block diagram of a flash EPROM 80 is shown with respect to the ready/busy indication of the flash EPROM. Flash EPROM 80 can be any one of flash EPROMs 62a–62j and 63a–63j of FIG. 3. As shown in FIG. 5, flash EPROM 80 includes a memory array 81 that includes memory cells for storing data at addresses. Flash EPROM 80 also includes a control circuit 82 for controlling memory operations of memory array 81. Control circuit 82 receives addresses, control signals, and/or data to perform a memory operation with respect to memory array 81. The memory operations of flash EPROM 80 may include read, programming, and erasure operations.

Flash EPROM 80 also includes a ready/busy control register 83 and a transistor 85. Ready/busy control register 83 is connected to control circuit 82 and the gate of transistor 85. For one embodiment, transistor 85 is an N-channel field effect transistor. For alternative embodiments, transistor 85 may be other types of transistors.

Transistor 85 has its source connected to ground and its drain connected to a ready/busy output pad RY/$\overline{BY}$ 84. As described above with respect to FIG. 3, each of flash EPROMs 62a–62j and 63a–63j includes a ready/busy output pin RY/$\overline{BY}$. Therefore, RY/$\overline{BY}$ pad 84 is the ready/busy output pin and the ready/busy indicator of flash EPROM 80. RY/$\overline{BY}$ pad 84 is used to indicate whether flash EPROM 80 is ready or busy. For example, when RY/$\overline{BY}$ pad 84 is connected to ground by transistor 85, it indicates a busy condition of flash EPROM 80. When RY/$\overline{BY}$ pad 84 is not connected to ground by transistor 85, it indicates a ready condition of flash EPROM 80. As can be seen from FIG. 5, ready/busy control register 83 controls transistor 85 to connect pad 84 to ground.

During operation, control circuit 82 generates a ready/busy indication signal to ready/busy control register 83. Ready/busy control register 83 uses the indication signal to control turning on transistor 85. When the indication signal stored in register 83 is in logical high state, transistor 85 is turned on which connects RY/$\overline{BY}$ pad 84 to ground.

For one embodiment, control circuit 82 generates a logical low ready indication signal to ready/busy control register 83 when control circuit 82 is in the "ready" condition, and generates a logical high busy indication signal to register 83 when control circuit 83 is in the "busy" condition. For one embodiment, control circuit 83 is in the "ready" condition when flash EPROM 80 is not undergoing the programming and erasure operations, and is in the "busy" condition when flash EPROM 80 is undergoing the programming or erasure operation. For another embodiment, control circuit 83 indicates that it is in the "busy" condition only when flash EPROM 80 is undergoing the erasure operation.

Control circuit 82 can mask the ready/busy indication signal. For example, when control circuit 82 outputs a logical high "busy" indication, the "busy" indication can be masked out by a data stored in a mask register (not shown in FIG. 5) inside control circuit 82.

Ready/busy register 83 can output a pulsed ready/busy indication signal or a level state ready/busy indication signal. When ready/busy register 83 outputs the pulsed ready/busy indication signal, the ready/busy RY/$\overline{BY}$ output signal at RY/$\overline{BY}$ pad 84 is also a pulse signal. This allows pad 84 not to hold a common node low for a relatively long time when pad 84 is ANDed at the common node with the RY/$\overline{BY}$ pad of other flash EPROMs. In addition, the pulsed logical low busy indication at RY/$\overline{BY}$ pad 84 allows the output indication signal of flash EPROM to be redefined to mean "Event Complete" or "Operation Complete."

When ready/busy control register 83 receives a logical high busy indication signal, transistor 85 is turned on and pad 84 is connected to ground. In this case, pad 84 indicates that flash EPROM 80 is presently busy. When register 83 receives a logical low ready indication signal, transistor 85 is turned off and pad 84 floats. This causes pad 84 to be in a high impedance state. In this case, pad 84 indicates that flash EPROM 80 is presently ready.

Since pad 84 is in the high impedance state when it indicates that flash EPROM 80 is presently ready, power consumption of flash EPROM 80 is reduced. In addition, the open drain connection of transistor 85 in flash EPROM 80 and the capability of control circuit 82 to mask out the ready/busy indication inside flash EPROM 80 makes it possible for pad 84 to be logical AND tied together with the ready/busy RY/$\overline{BY}$ pad of other flash EPROMs to generate a card ready/busy indication signal. This simplifies the logic in an external card control logic (which will be described below) to generate the card ready/busy RDY/$\overline{BSY}$ signal and reduces the input pin count of the card control logic. The RY/$\overline{BY}$ pads of flash EPROMs are AND tied together to generate the card ready/busy RDY/$\overline{BSY}$ signal. When all of the RY/$\overline{BY}$ pads are at logical high state, the card ready/busy RDY/$\overline{BSY}$ signal is logically high. When at least one RY/$\overline{BY}$ pad of the flash EPROMs is at logical low state, the card ready/busy RDY/$\overline{BSY}$ signal is logically low. This will be described in more detail below, in connection with FIGS. 3 and 4.

Returning to FIG. 3, flash memory card 40 further includes card control logic 70. Card control logic 70 interfaces between card pins of flash memory card 40 and flash EPROMs 62a–62j and 63a–63j. Card control logic 70 provides control logic for flash memory card 40. Card control logic 70 receives addresses, data, control signals, power and ground. Card control logic 70 in turn (1) facilitates control of reading, erasing, and programming with respect to flash EPROMs 62a–62j and 63a–63j, (2) facilitates control of the use of electrical power within flash memory card 40, (3) facilitates control of the sending out to the external host computer (not shown) card information structure data with respect to flash memory card 40, and (4) facilitates control of the sending out to the host computer status information regarding flash memory card 40.

Flash memory card 40 includes data pins CDATA. Data pins CDATA are coupled to card control logic 70.

Flash memory card 40 receives card enable inputs $\overline{CE}_1$ and $\overline{CE}_2$ and card output enable input $\overline{OE}$. Card enables $\overline{CE}_1$ and $\overline{CE}_2$ are chip selects for selecting flash EPROMs 62a–62j and 63a–63j. Card output enable $\overline{OE}$ is the output control of the card. The $\overline{OE}$ signal is processed by card control logic 70 to become the $\overline{COE}$ signal.

Flash memory card 40 also includes a card write enable pin $\overline{WE}$. The card write $\overline{WE}$ controls writes to card control logic 70 and flash EPROMs 62a–62j and 63a–63j. The $\overline{WE}$ is processed by card control logic 70 to become a $\overline{CWE}$ signal which is coupled to the $\overline{WE}$ input of each of flash EPROMs 62a–62j and 63a–63j via line 68.

Flash memory card 40 includes an active low register memory select input pin $\overline{REG}$. The $\overline{REG}$ signal controls the operation to either flash EPROMs 62a–62j and 63a–63j or card control logic 70.

Flash memory card 40 also includes a write protection output pin WP. When the WP pin is at active high voltage, all write operations to the card are disabled.

$V_{CC}$ is the card power supply for flash memory card 40 and $V_{PP}$ is the card program/erase power supply. $V_{SS}$ is ground. For one embodiment, card power supply $V_{CC}$ of flash memory card 40 is approximately 5 volts. For another embodiment, card power supply $V_{CC}$ is approximately 3.0 volts. For one embodiment, the card program/erase power supply of flash memory card 40 is approximately 12 volts.

Card control logic 70 also includes a power control logic 71. Power control logic 71 outputs a power control signal $\overline{CPWD}$ to the $\overline{PWD}$ pin of each of flash EPROMs 62a–62j and 63a–63j via a single signal line 69. When power control logic 71 generates a power down $\overline{CPWD}$ signal on line 69, each of flash EPROMs 60 receives the signal at its PWD pin that causes each of flash EPROMs 62a–62j and 63a–63j to be in the power down mode in which power consumption of each of flash EPROMs 60 is significantly reduced.

Flash memory card 40 also includes a card ready/busy output pin RDY/$\overline{BSY}$. The card ready/busy RDY/$\overline{BSY}$ output indicates whether the card is busy or ready. The card ready/busy output pin RDY/$\overline{BSY}$ is one of the output pins of card control logic 70. Card control logic 70 generates the card ready/busy output RDY/$\overline{BSY}$ signal based on the ready/busy output RY/$\overline{BY}$ of each of flash EPROMs 62a–62j and 63a–63j. As can be seen from FIG. 3, card control logic 70 includes an output driver 72 to generate the card ready/busy RDY/$\overline{BSY}$ signal. Output driver 72 has its output connected to the card ready/busy output pin RDY/$\overline{BSY}$ and its input connected to a common node 75 via a single signal line 66 to receive the card ready/busy output RDY/$\overline{BSY}$. Therefore, driver 72 only drives the card ready/busy RDY/$\overline{BSY}$ signal through card control logic 70.

Node 75 is coupled to the $V_{CC}$ power supply via a resistor 65. Node 75 is also coupled to the RY/$\overline{BY}$ output pin of each of flash EPROMs 62a–62j and 63a–63j.

Figure 4:
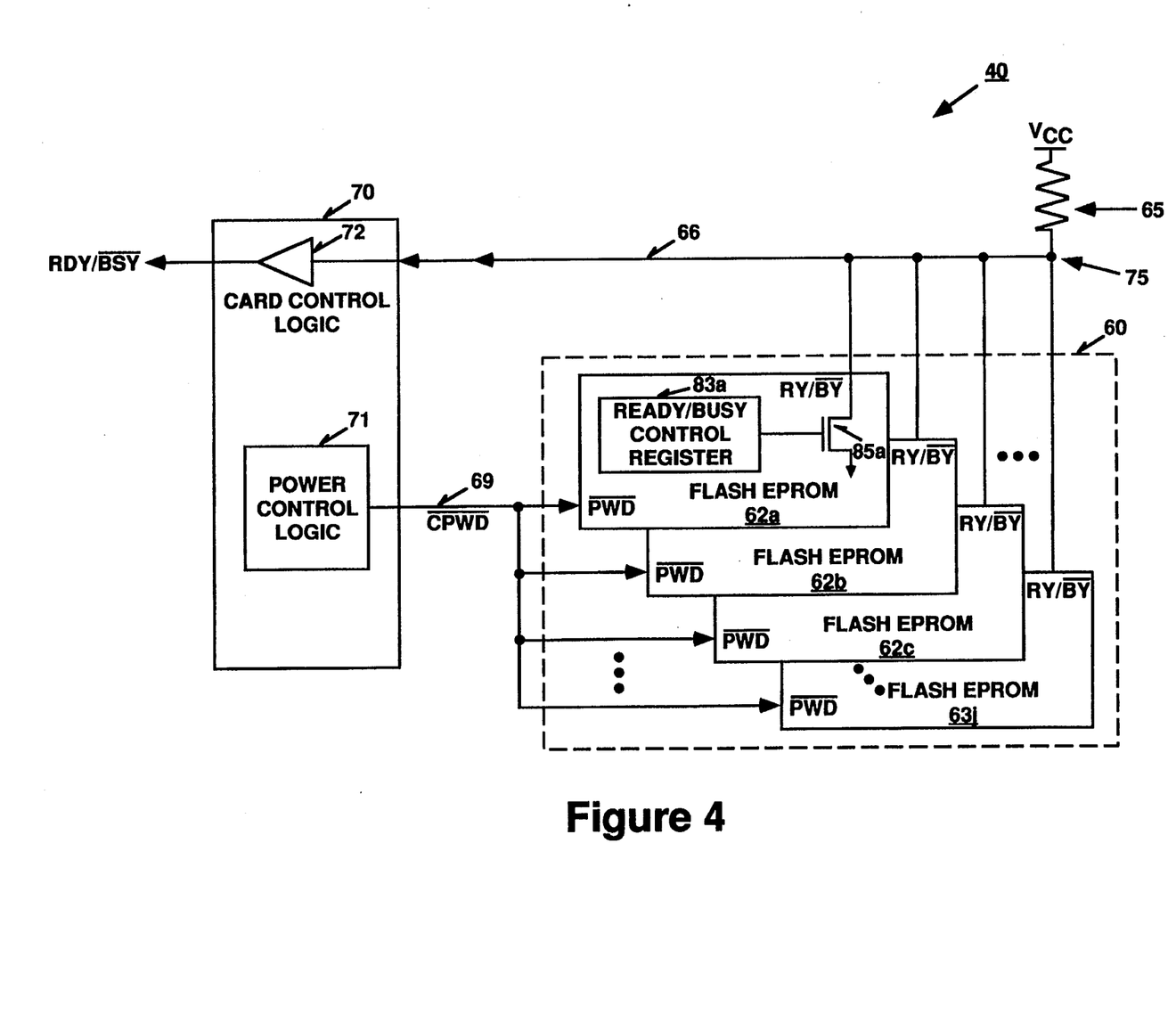
FIG. 4 is an illustration of the flash memory card of FIG. 3 with respect to the card ready/busy signal generation.

FIG. 4 illustrates in more detail the generation of the card ready/busy indication signal. As can be seen from FIG. 4, the RY/$\overline{BY}$ output pin of each of flash EPROMs 62a–62j and 63a–63j are tied together to node 75. This causes the RY/$\overline{BY}$ output of each of flash EPROMs 62a–62j and 63a–63j to be logically ANDed at node 75. This, in turn, generates the card ready/busy RDY/$\overline{BSY}$ signal to card control logic 70 via a single signal line 66. Card control logic 70 is connected to signal line 66 via a single input pin. This significantly reduces the pin count of card control logic 70.

In addition, card control logic 70 uses driver 72 to pass the card ready/busy output signal to the RDY/$\overline{BSY}$ output pin of flash memory card 40. This eliminates the respective registers for storing the individual RY/$\overline{BY}$ signal from each of flash EPROMs 62a–62j and 63a–63j in card control logic 70, and simplifies the logic of card control logic 70.

By eliminating the registers in card control logic 70, it is not needed to communicate with the attribute memory region in card control logic 70 during a memory operation. The external host computer only needs to access the common memory region that includes flash EPROMs 60. This simplifies the flash file system software running in card control logic 70, which in turn allows fast access for the memory operation. In addition, no mapping is required and less system hardware and software in card control logic 70 is needed.

Referring to FIG. 5, flash EPROM 80 also includes a power down pad $\overline{PWD}$ 87 for receiving the global power down control signal $\overline{CPWD}$. Flash EPROM 80 also includes a register 89 coupled to control circuit 82 for receiving a software activated power down control signal $\overline{PWD\_SW}$. The two signals are applied to an AND gate 88 to generate the power down control signal $\overline{PWD}$ for flash EPROM 80. The global power down $\overline{CPWD}$ signal is supplied from power control logic 71 of card control logic 70. This arrangement enables individual flash EPROM to be powered down by the software control. It also allows global hardware power down of all the flash EPROMs within a flash memory card.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:
   (A) a memory array;
   (B) a control circuit coupled to the memory array for controlling memory operations with respect to the memory array;
   (C) an output pad for applying a signal to an external circuit indicating that the control circuit is busy with respect to one of the memory operations;
   (D) a circuit coupled to the output pad and the control circuit for connecting the output pad to a ground potential to generate the signal at the output pad, wherein the circuit further comprises an open drain transistor circuit coupled between the output pad and the ground potential such that the output pad of the nonvolatile memory can be tied together with an output pad of another nonvolatile memory;
   (E) an input pad for receiving a global power down control signal;
   (F) a power down control register coupled to the control circuit for receiving a software power down control signal;
   (G) a logic gate coupled to the input pad and the power down control register for performing a logic function to the global power down control signal and the software cower down control signal such that the nonvolatile memory can be cowered down by one of the global power down control signal and the software power down control signal.

2. The nonvolatile memory of claim 1, wherein the transistor has a gate coupled to receive a control signal from the control circuit that controls the transistor to couple the output pad to the ground potential.

3. The nonvolatile memory of claim 2, wherein the circuit further comprises a register circuit for storing the control signal from the control circuit.

4. The nonvolatile memory of claim 2, wherein the circuit further comprises a pulse generation circuit for supplying the control signal from the control circuit to the transistor in a pulse format.

5. The nonvolatile memory of claim 3, wherein the control circuit generates the control signal to cause the circuit to couple the output pad to the ground potential when the control circuit is busy with respect to one of the memory operations.

6. The nonvolatile memory of claim 5, wherein the one of the memory operations is an erasure operation.

7. The nonvolatile memory of claim 1, wherein the memory array includes memory cells that are electrically programmable and electrically erasable.

8. A memory card for use in a computer system, comprising:
   (A) a plurality of nonvolatile memories, wherein each of the memories further comprises
      (i) a pad for applying a busy signal indicating that a respective one of the memories is busy with respect to a memory operation;
      (ii) a circuit coupled to the pad and a control circuit for coupling the pad to a ground potential in order to generate the busy signal at the pad, wherein the circuit further comprises an open drain transistor circuit coupled between the pad and the ground potential, wherein the pad of each of the memories is coupled to a node external to the memories;
      (iii) an input pad for receiving a global power down control signal;
      (iv) a power down control register coupled to the control circuit for receiving a software power down control signal;
      (v) a logic gate coupled to the input pad and the power down control register for performing a logic function to the global power down control signal and the software power down control signal such that the nonvolatile memory can be powered down by one of the global power down control signal and the software power down control signal;
   (B) a resistive circuit coupled to the node for coupling a first voltage to the node, wherein when each of the memories does not output the busy signal at the pad, the node assumes a voltage which is approximately equal to the first voltage, wherein when at least one of the memories outputs the busy signal, the node assumes the ground potential;
   (C) a card control logic for interfacing the memories with an external circuit, wherein the card control logic further comprises
      (a) an output pin for supplying a card busy signal to the external circuit when at least one of the memories is indicated to be busy with respect to the memory operation;
      (b) an input pin coupled to the node for receiving the card busy signal at the node, wherein the input pin receives the card busy signal when the node assumes the ground potential;
      (c) a pass logic coupled to the input and output pins for passing the card busy signal directly from the input pin to the output pin such that the card control logic has minimized pin count.

9. The memory card of claim 8, wherein the transistor has a gate coupled to receive a control signal that controls the transistor to couple the pad to the ground potential in order to supply the busy signal.

10. The memory card of claim 9, wherein the circuit further comprises a register circuit for storing the control signal.

11. The memory card of claim 9, wherein the circuit further comprises a pulse generation circuit for supplying the control signal from the control circuit to the transistor in a pulse format.

12. The memory card of claim 8, wherein the memory operation is an erasure operation.

13. The memory card of claim 8, wherein the resistive circuit further comprises a resistor.

14. The memory card of claim 8, wherein each of the plurality of memories includes memory cells that are electrically programmable and electrically erasable.

15. The memory card of claim 8, wherein the pass logic is a single output driver for driving the card busy signal from the input pin to the output pin.

16. The memory card of claim 8, wherein the card control logic further comprises a power down control logic for generating the global power down control signal to the input pad of each of the nonvolatile memories such that the card control logic has minimized pin count to enable high storage capacity.

17. A nonvolatile memory, comprising:
(A) a memory array;
(B) a control circuit coupled to the memory array for controlling memory operations with respect to the memory array;
(C) an input pad for receiving a global power down control signal;
(D) a power down control register coupled to the control circuit for receiving a software power down control signal;
(E) a logic gate coupled to the input pad and the power down control register for performing a logic function to the global power down control signal and the software power down control signal such that the nonvolatile memory can be powered down by one of the global power down control signal and the software power down control signal.

18. The nonvolatile memory of claim 17, wherein the logic gate is an AND gate.

* * * * *

UNITED STATES PATENT AND TRADEMARK OFFICE
CERTIFICATE OF CORRECTION

PATENT NO.   :   5,428,566
DATED        :   June 27, 1995
INVENTOR(S)  :   Kurt B. Robinson It is certified that error appears in the above-identified patent and that said Letters Patent is hereby corrected as shown below:

In column 8 at line 20 delete "PWD" and insert --$\overline{PWD}$--

In column 8 at line 42 delete "RY/BY" and insert --RY/$\overline{BY}$--

In column 8 at line 46 delete "RY/BY" and insert --RY/$\overline{BY}$--

In column 9 at line 51 delete "cower" and insert --power--

In column 9 at line 52 delete "cowered" and insert --powered--

Signed and Sealed this

Twelfth Day of November, 1996

Attest:

BRUCE LEHMAN

*Attesting Officer*            *Commissioner of Patents and Trademarks*